(12) United States Patent
Venkata

(10) Patent No.: US 10,418,088 B2
(45) Date of Patent: *Sep. 17, 2019

(54) POWER REDUCTION TECHNIQUE DURING READ/WRITE BURSTS

(71) Applicant: Micron Technology, Inc., Boise, ID (US)

(72) Inventor: Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/193,825

(22) Filed: Nov. 16, 2018

(65) Prior Publication Data

US 2019/0206476 A1    Jul. 4, 2019

Related U.S. Application Data

(63) Continuation of application No. 15/856,826, filed on Dec. 28, 2017, now Pat. No. 10,157,659.

(51) Int. Cl.

| G11C 7/22 | (2006.01) |
|---|---|
| G11C 11/4074 | (2006.01) |
| G11C 11/4096 | (2006.01) |
| G11C 29/52 | (2006.01) |
| G06F 11/10 | (2006.01) |
| G11C 7/10 | (2006.01) |
| H01L 27/108 | (2006.01) |
| G11C 29/04 | (2006.01) |

(52) U.S. Cl.
CPC ...... *G11C 11/4074* (2013.01); *G06F 11/1068* (2013.01); *G11C 7/1018* (2013.01); *G11C 7/1078* (2013.01); *G11C 7/1096* (2013.01); *G11C 11/4096* (2013.01); *G11C 29/52* (2013.01); *G11C 2029/0411* (2013.01); *H01L 27/10897* (2013.01)

(58) Field of Classification Search
CPC .. G11C 7/12; G11C 7/222; G11C 8/10; G11C 11/40615; G11C 11/4074; G11C 11/4091; G11C 16/08; G11C 29/028; G11C 7/18; G11C 7/22; G11C 11/4076; G11C 11/419; G11C 16/26; G11C 5/147; G11C 16/10; G11C 7/1072; G11C 11/4087; G11C 11/4093; G11C 16/0483; G11C 5/025
USPC .. 365/189.05, 201, 63, 194, 230.03, 230.06, 365/189.02, 207, 233.1, 233.13, 154, 365/185.01, 185.05
See application file for complete search history.

(56) References Cited

U.S. PATENT DOCUMENTS 10,157,659 B1 * 12/2018 Venkata ............... G11C 7/1078
2007/0245093 A1 10/2007 Do et al.

* cited by examiner

*Primary Examiner* — Thong Q Le
(74) *Attorney, Agent, or Firm* — Fletcher Yoder, P.C.

(57) ABSTRACT

A memory device may include one or more memory banks that store digital data. The memory device includes first tri-state driver circuitry that provides a first signal to a first data read/write (DRW) line coupled between write driver circuitry and one or more DQ pads. The first signal is indicative of either a high state or a medium state. The memory device includes second tri-state driver circuitry that provides a second signal to a second data read/write (DRW) line coupled between the write driver circuitry and the one or more DQ pads. The second signal is indicative of either a medium state or a low state. A voltage level of the medium state is between a voltage level of the high state and a voltage level of the low state.

20 Claims, 5 Drawing Sheets

POWER REDUCTION TECHNIQUE DURING READ/WRITE BURSTS

CROSS-REFERENCE TO RELATED APPLICATIONS

The present application is a continuation of U.S. application Ser. No. 15/856,826, entitled "Power Reduction Technique During Read/Write Bursts," and filed Dec. 28, 2017, the entirety of which is incorporated by reference herein for all purposes.

BACKGROUND

Field of the Present Disclosure

Embodiments of the present disclosure relate generally to the field of semiconductor devices. More specifically, embodiments of the present disclosure relate to reducing power consumption when reading data from and/or writing data to memory devices.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Random access memory (RAM) devices, such as a dynamic random-access memory (DRAM), may perform operations to fetch data from memory banks and write operations to store data into the memory banks. Certain RAM devices, such as synchronous dynamic RAM (SDRAM) devices may, for example, have multiple memory banks having many addressable memory elements. RAM devices may also have a communications interface that may receive addresses, instructions (e.g., read, write, etc.) for operations that may be associated with those addresses, and data associated with those instructions. Communications circuitry may process the data and addresses to access the corresponding memory banks. Communication lines, such as data transmission lines or paths, may be used to deliver data to the memory banks and to retrieve data from the memory banks. As storage in the memory banks increases to store more data, additional power may be utilized to access the memory banks. For example, as memory banks increase storage, additional communication lines may be added to the memory. However, adding additional communication lines may result in increased power consumption by the memory. Additionally, due to the additional communication lines, capacitance between the communication lines may increase power usage as well.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A semiconductor memory device, such as double data rate type five synchronous dynamic random access memory (DDR5 SDRAM), may include several banks of memory that store data. Data lines, or data read/write (DRW) lines, may run between the data input/output pads, referred to as DQ pads, and data write drivers along the memory banks. As memory storage in each bank increases, the number of DRW lines that run to the data write drivers may increase. Further, there may be additional capacitance due to the data lines being proximate to one another. Because of additional DRW lines and the additional capacitance, additional power may be consumed to send and receive data across the additional data lines.

As described below, to reduce power consumed, such as during read and write operations, first tri-state driver circuitry may provide a first signal in either a HIGH state or a MEDIUM state across a first DRW line. Second tri-state driver circuitry may provide a second signal in either the MEDIUM state or a LOW state across a second DRW line. Charge from the first tri-state driver circuitry may be provided to voltage regulation circuitry of the second tri-state driver circuitry to be used in providing the second signal. By operating the first DRW line and the second DRW line at half swings between HIGH and MEDIUM or between MEDIUM and low, less power may be consumed. Additionally, by using charge from the first tri-state driver circuitry on at the second tri-state driver circuitry power may be conserved.

Figure 1:
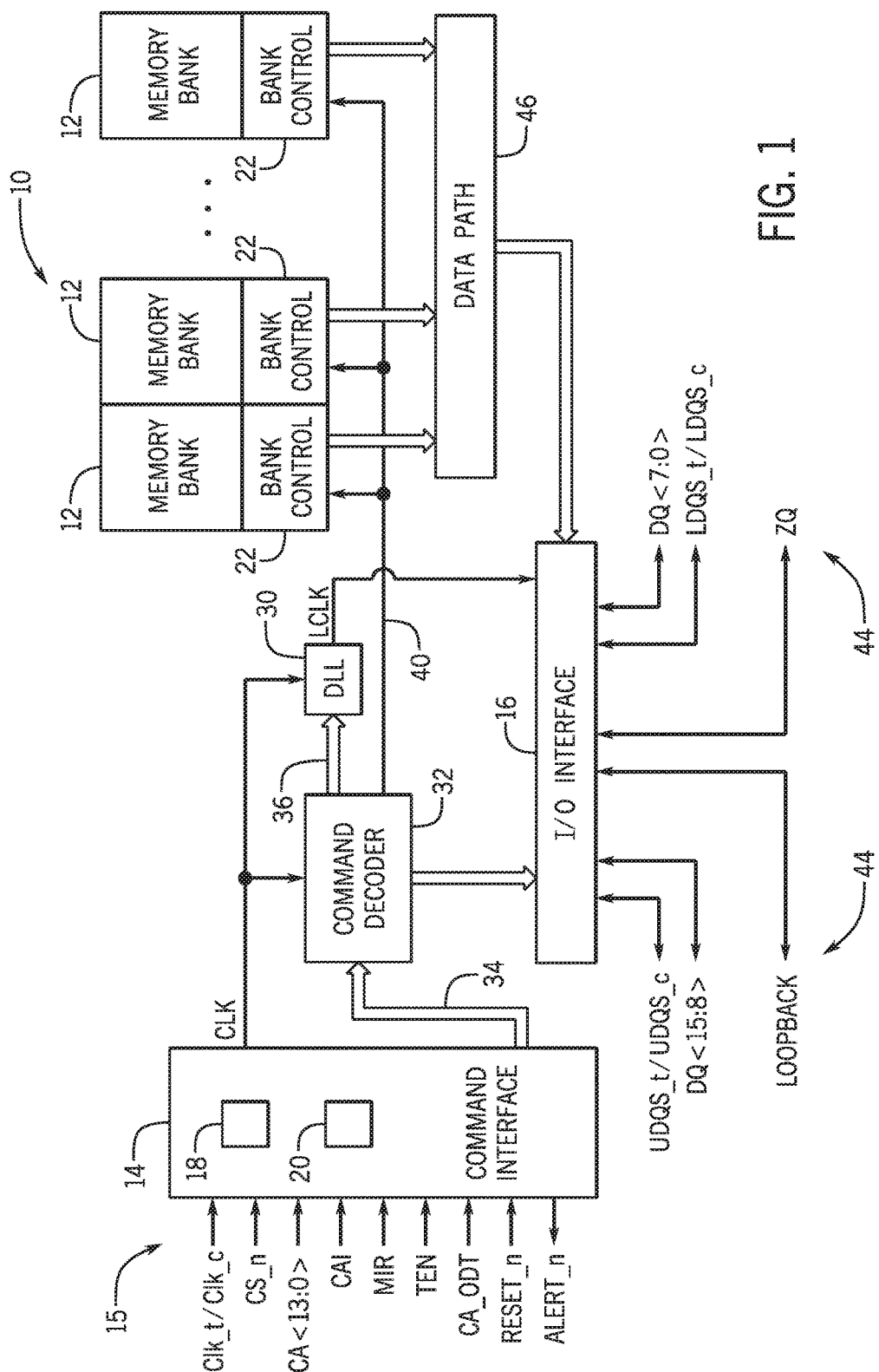
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
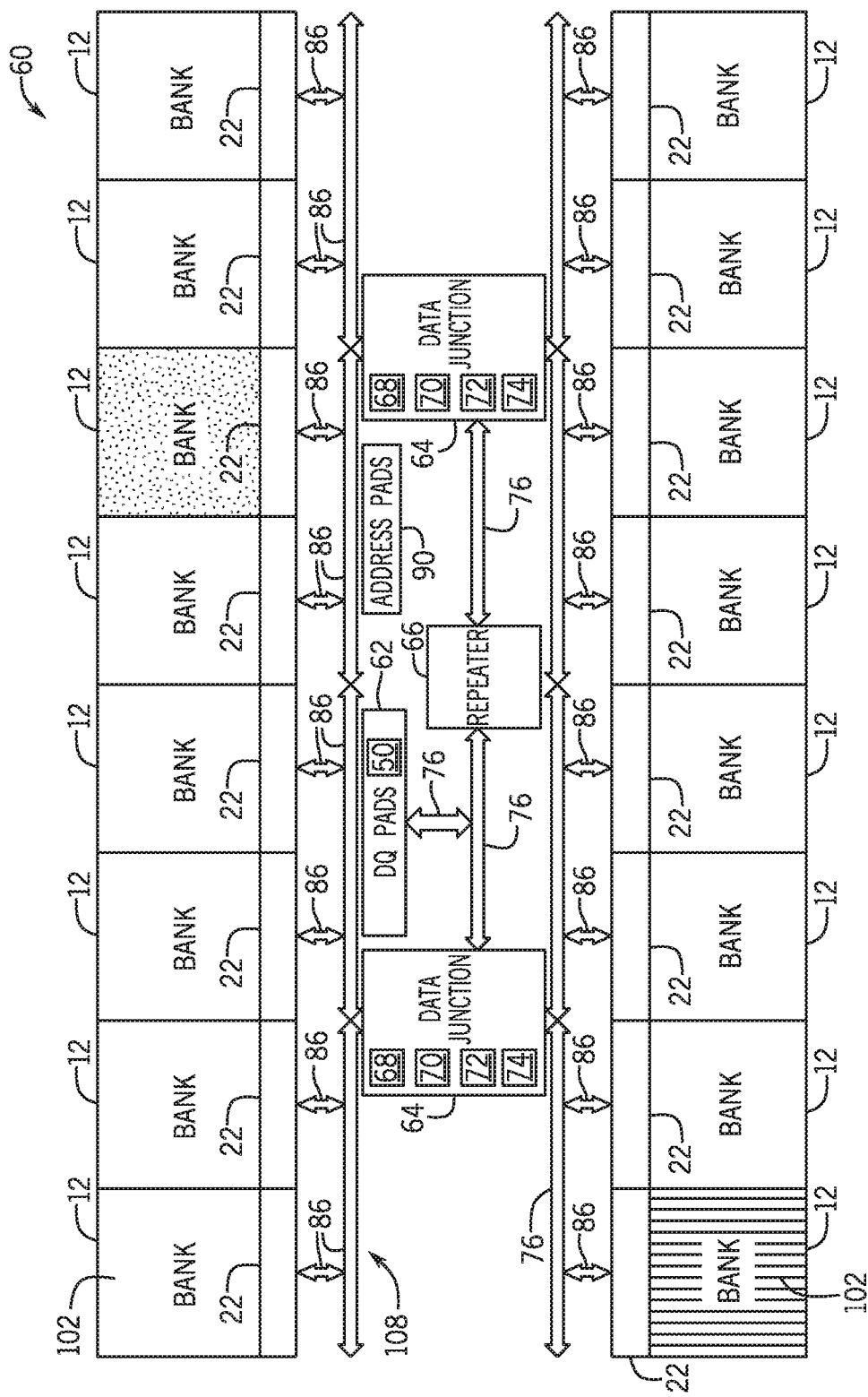
FIG. 2 is a block diagram illustrating an embodiment of a data path architecture suitable for lowering power consumption of the memory device shown in FIG. 1.

Turning now to FIG. 2, a block diagram illustrating an embodiment of a data path architecture 60 suitable for lowering power consumption of the memory device 10 is shown. Because the figure depicts like elements as those found in FIG. 1, the like elements are illustrated with like numbers. In the depicted embodiment, DQ pad(s) 62 may be used to communicate the IO signals (e.g., DQ<15:8> and DQ<7:0> shown in FIG. 1) to external devices, such as processors, field programmable arrays (FPGAs), and so on. The data communicated via the DQ pad(s) 62 may be converted by the one-hot communications interface 50 for transmittal or for receipt as one-hot signals through the data path 46. The DQ pads 62 may be included in the I/O interface 16 or communicatively connected to the I/O interface 16.

In the depicted embodiment, the data path 46 includes two data junctions 64 communicatively coupled to each other via a repeater 66. The data junctions 64 may channel data into/out of memory banks 12 during data transmission via the data path 46. Accordingly, each data junction 64 may include multiple systems, such as multiplexors 68, drivers 70, keepers 72, and other systems 74 as shown, suitable for data distribution. Further, the data path architecture may include address pads 90. Data may be communicated via the communication lines, such as a tCCDS path 76 and a tCCDL path 86. The tCCDS path 76 may refer to a communication path used to access a bank from different bank groups via the repeaters 66 and/or data junctions 64. The tCCDL path 86 may refer to a communication path used to access a bank within the same bank group. The repeater 66 may be used to span longer distances in a die, for example, by boosting signals to forward the data from one data junction 64 to another data junction 64. The communicated data may thus traverse through one or more tCCDS path 76 into or out of the memory banks 12.

Further, each of the bank control blocks may include write driver circuitry 98 that receive and send data signals to data storage circuitry 104 of the memory bank 12 via data lines, referred to as main input/output (MIO) lines 102. The communication lines 76 may include data read/write (DRW) lines 108 that are bidirectional lines that span between one or more DQ pads 50. In DRAM memory, data is read and written at different times from each other to allow the bidirectional line to communicate in both directions. That is, the write diver circuitry 98 may receive signals from the DQ pads 50 via the DRW lines 108 and send signals via the MIO lines 102 to data storage circuitry 104 of the memory banks 12 to write data into the memory at a first period of time. At a second period of time, the write driver circuitry 98 may receive signals from the data storage circuitry 104 via the MIO lines 102 and send signals to the DQ pads 50 via the DRW lines 108. By performing these operations at different times, in some embodiments, a single line may be used to enable bidirectional communication between the write driver circuitry 97 and the DQ pads 50 for each write driver circuitry 98 and DQ pad connection. The write driver circuitry 98 may include individual write driver circuits for each of the data storage circuitry 100 of the memory bank 12 to write data into and/or read data from each data storage circuitry 100 in the memory bank 12 and to send data to and/or receive data from a DQ pad via a DRW line 108. Various techniques may be used to communicate data to and from the memory bank 12 via the DRW lines 108. One of the techniques used to communicate data via the DRW lines is described with respect to FIG. 3.

Figure 3:
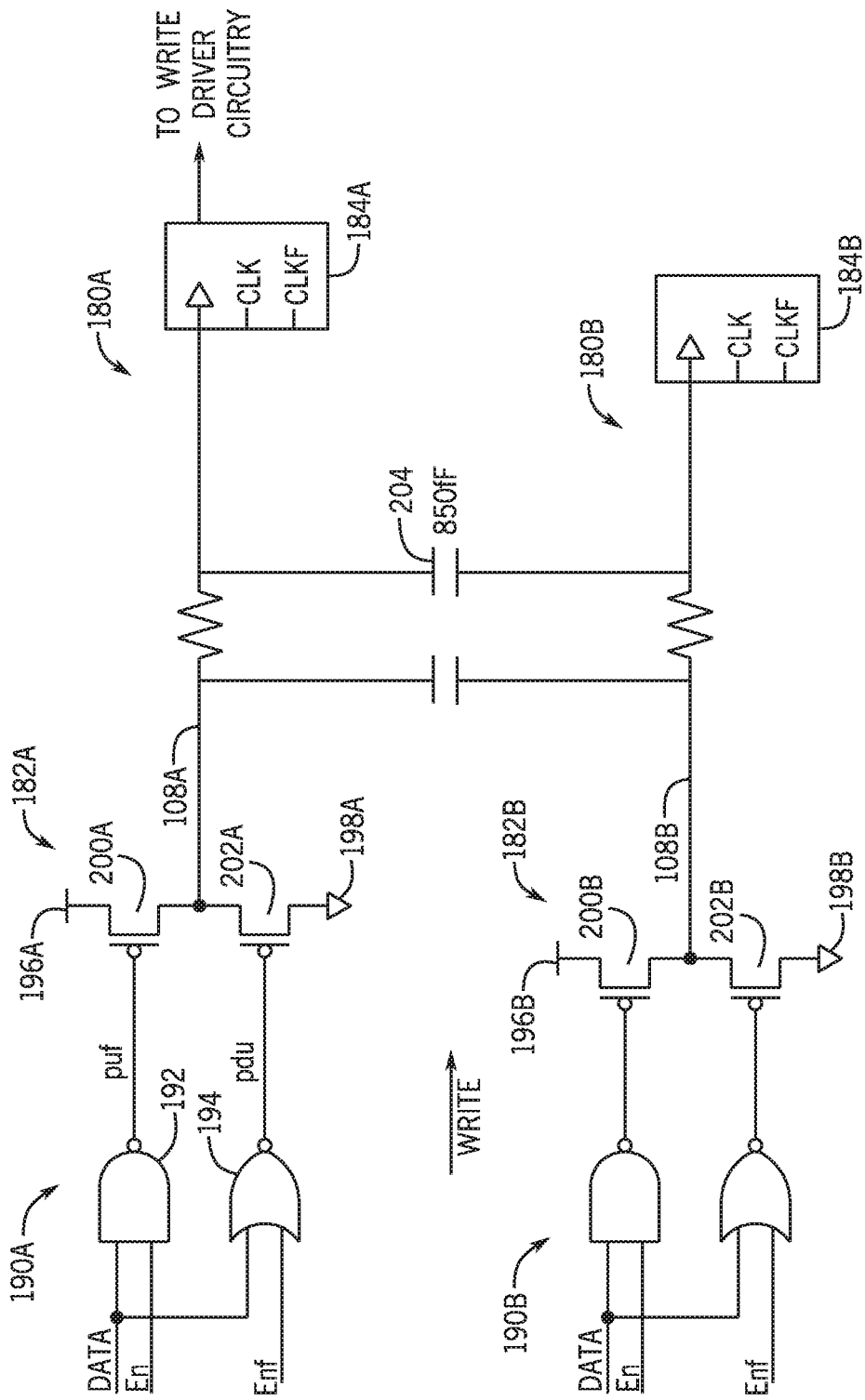
FIG. 3 is a circuit diagram illustrating certain features of a first example of the data path architecture of FIG. 2, according to an embodiment of the present disclosure.

FIG. 3 illustrates one embodiment of circuitry of two example DRW lines 108 (e.g., DRW line 108A and DRW line 108B) between one or more DQ pads 50 and the write driver circuitry 98. The read/write circuitry 180A includes DRW lines 108A and 108B, which may illustrative of two example lines of DRW lines 108 in FIG. 2. While the read/write circuitry 180A associated with the first DRW line 108A is be described in detail below, the read/write circuitry 180B may include circuitry similar or identical to read/write circuitry 180A. The read/write circuitry 180A includes DRW line 108A, tri-state driver circuitry 182A, and register circuitry 184A. The register circuitry 184A may be electrically coupled between the DRW line 108A and the write driver circuitry 98. Register circuitry 184A may capture the data. For example, the register circuitry 184A may include flip flop circuitry that clocks and captures the data to provide the data to the write driver circuitry 98. The write driver circuitry 98 may then write the data into the memory banks 12.

As mentioned above, the DRW line 108A may be a bidirectional line used to both read and write data at different times. The one or more DQ pads 50 may be associated with the tri-state driver circuitry 182A that provides data to the register circuitry 184A of the write driver circuitry 98 of the memory banks 12. During a write operation, the tri-state driver circuitry 182A may be used to provide data to the register circuitry 184A as illustrated. Conversely, similar circuitry to the tri-state driver circuitry 182A may be located on the write driver circuitry 98 side of the DRW line 108A to provide data to the DQ pads 50 in a read operation. That is, while a write operation and write circuitry is shown in FIG. 3, the circuit diagram is simply meant to be illustrative to explain operations performed by the DRW lines 108A, and similar circuitry may be located on opposite sides of the illustrated register circuitry 184A to perform read operations.

During a write operation, a data signal from the DQ pads 50 may be received by logic circuitry 190A. The logic circuitry 190A may further receive an enable (En) signal and an enable false (EnF) signal via the DQ pads 50 indicative of a time at which the data signal is to be written. For example, the enable and enable false signals may be DQS signals driven by an external processor or controller sending the data (e.g., for a write command) or by the memory device 10 (e.g., for a read command). The enable false signal may be a complementary signal such that if the enable signal is in a HIGH state, then the enable false (enF) signal is in a LOW state. Further, if the enable signal is in a LOW state, then the enable false signal is in a HIGH state.

In the illustrated embodiment, the tri-state driver circuitry 182A receives a signal having a voltage a voltage supply 196A, a first transistor 200A coupled between the voltage supply 196A and the DRW line 108A, and a second transistor 202A coupled between the DRW line 108A and ground 198A. The data signal, the enable signal, and the enable false signal are received by the logic circuitry 190A. If the enable signal is in the HIGH state, a NAND gate 192 and a NOR gate 194 of the logic circuitry 190A are enabled to cause the tri-state driver circuitry 182A to drive a signal across the DRW line 108A based on whether the data is in a HIGH state or a LOW state. If the tri-state driver circuitry 182A receives the enable signal in the LOW state, the tri-state driver 182A is turned off. That is, the tri-state driver circuitry 182A may operate in a HIGH state, a LOW state, and an OFF state. When enabled during a write operation, the tri-state driver circuitry 182A may provide either a HIGH signal or a LOW signal on the DRW line 108A to the register circuitry 184A. Upon receiving the HIGH signal or the LOW signal, the register circuitry 184A may store a state based on the signal. The register circuitry 184A may then provide a signal to the write driver circuitry 98 to write a value into the memory bank 12 based on the stored state.

As mentioned above, the additional read/write circuitry 180B includes similar or identical circuitry to the read/write circuitry 180A discussed above. For example, the additional read/write circuitry 180B may include logic circuitry 190B, tri-state driver circuitry 182B, DRW line 108B, and register circuitry 184B similar or identical to the logic circuitry 190A, tri-state driver circuitry 182B, DRW line 108A, and register circuitry 184A, respectively. As additional data storage circuitry 104 is included in the memory banks 12 to allow the memory banks 12 to store more data, additional DRW lines 108 between the write driver circuitry 98 and the DQ pads 50 may be added. However, adding additional DRW lines 108 may increase the amount of power consumed by communicating additional data across the DRW lines 108 during memory operations. For example, toggling between the HIGH state and the LOW state, referred to as a full swing, may cause the read/write circuitry 180 to consume power.

Further, positioning the DRW lines 108 in closer proximity may increase capacitance between the lines. In the illustrated embodiment, the DRW lines 108A and 108B may include capacitance 204 between each other caused by the physical properties of the DRW lines 108, such as the line proximity and the conductivity of the DRW lines 108. The capacitance 204 may cause additional power to be consumed in communicating data over the DRW lines 108.

For example, in a 16n bit pre-fetch memory with a data bus with 256 lanes wide, the following equation (1) may be used to estimate the current drawn during a read operation:

$$\text{Read current} = C * \frac{dV}{dt} \quad (1)$$

where read current is the current through the DRW line 108A, C is the capacitance between the DRW line 108A and the DRW line 108B, dV is a change in voltage from the HIGH state to the LOW state or the LOW state to the HIGH state, and dt is two times an amount of time to access a bank from different bank groups, referred to as tCCDS, or dt is two times an amount of time to access a bank within the same bank group, referred to as tCCDL. In the illustrated embodiment, the capacitance 204 is estimated as 850 femtofarads (fF). Further, as an example, tCCDS may be 2.5 nanoseconds and tCCDL may be 5.0 nanoseconds, the change in voltage may be 1.1 volts, and the data bus may be 256 lanes wide. These values are simply used as examples for the illustrated embodiment, and any suitable values may be used.

In the above example, the total average current may be based on the following equation:

Total average current=read current in tCCDS+2*read current in tCCDL  (2)

Using the above example values in equation (2), the total average current may be:

$$\text{Total average} = 850 \; fF * 256 * \frac{1.1 \text{ v}}{5 \text{ ns}} + 2 * 850 \; fF * \frac{1.1 \text{ v}}{10 \text{ ns}} = 95.7 \text{ mA} \quad (3)$$

In this example, each tri-state driver circuitry 182A and 182B may drive a voltage of either the HIGH state or the LOW state. That is, the tri-state driver circuitry 182A and 182B may each either provide a signal at 1.1 volts (e.g., at a HIGH voltage level) by closing the transistor 200A and 200B to the voltage supply 196A and 196B or provide a signal at 0 volts (e.g., at a LOW voltage level) by closing the transistor 202A and 202B to ground 198A and 198B.

By using charge from first tri-state driver circuitry of a first DRW line to charge second tri-state driver circuitry of a second line, the read/write circuitry 180 between the one or more DQ pads 50 and the write driver circuitry 98 may reduce power consumed during read/write operations. That is, the first tri-state driver circuitry may provide (e.g., dump) charge to voltage regulation circuitry that drives the second tri-state driver circuitry. For example, the second tri-state driver circuitry may be precharged to a HIGH state, such as $V_{DD}$. $V_{DD}$ may refer to an operating voltage of the memory, such as 1.1 volts, 1.2 volts, or any other suitable voltage. To provide data across the first DRW line, the first tri-state driver circuitry may provide a signal at the HIGH state or at a voltage between $V_{DD}$ and ground referred to as a MEDIUM state, such as $V_{DD}/2$ or another voltage value between the aforementioned HIGH voltage level and LOW voltage level. That is, the HIGH state of the first tri-state driver circuitry may be indicative of data being a first value (e.g., one) and the MEDIUM state may be indicative of data being a second value (e.g., zero) while having an actual voltage value at a level greater than the LOW voltage level.

If the first tri-state driver circuitry sends a signal at the MEDIUM state, charge may be provided to the voltage regulation circuitry of the second tri-state driver circuitry. The second tri-state driver circuitry may then provide data across the second DRW line at the MEDIUM state, using charge from the first tri-state driver circuitry, or at a LOW state, such as ground. That is, the MEDIUM state of the second tri-state driver circuitry may be indicative of data being a first value (e.g., one) and the LOW state may be indicative of data being a second value (e.g., zero). In this manner, the first DRW line and the second DRW line may operate at smaller swings (e.g., half swings) in voltage than the full swing described with respect to FIG. 3, thereby saving power consumed in communicated data over the DRW lines. Further, power may be saved by using charge from the first tri-state driver circuitry to operate the second tri-state driver circuitry.

Figure 4:
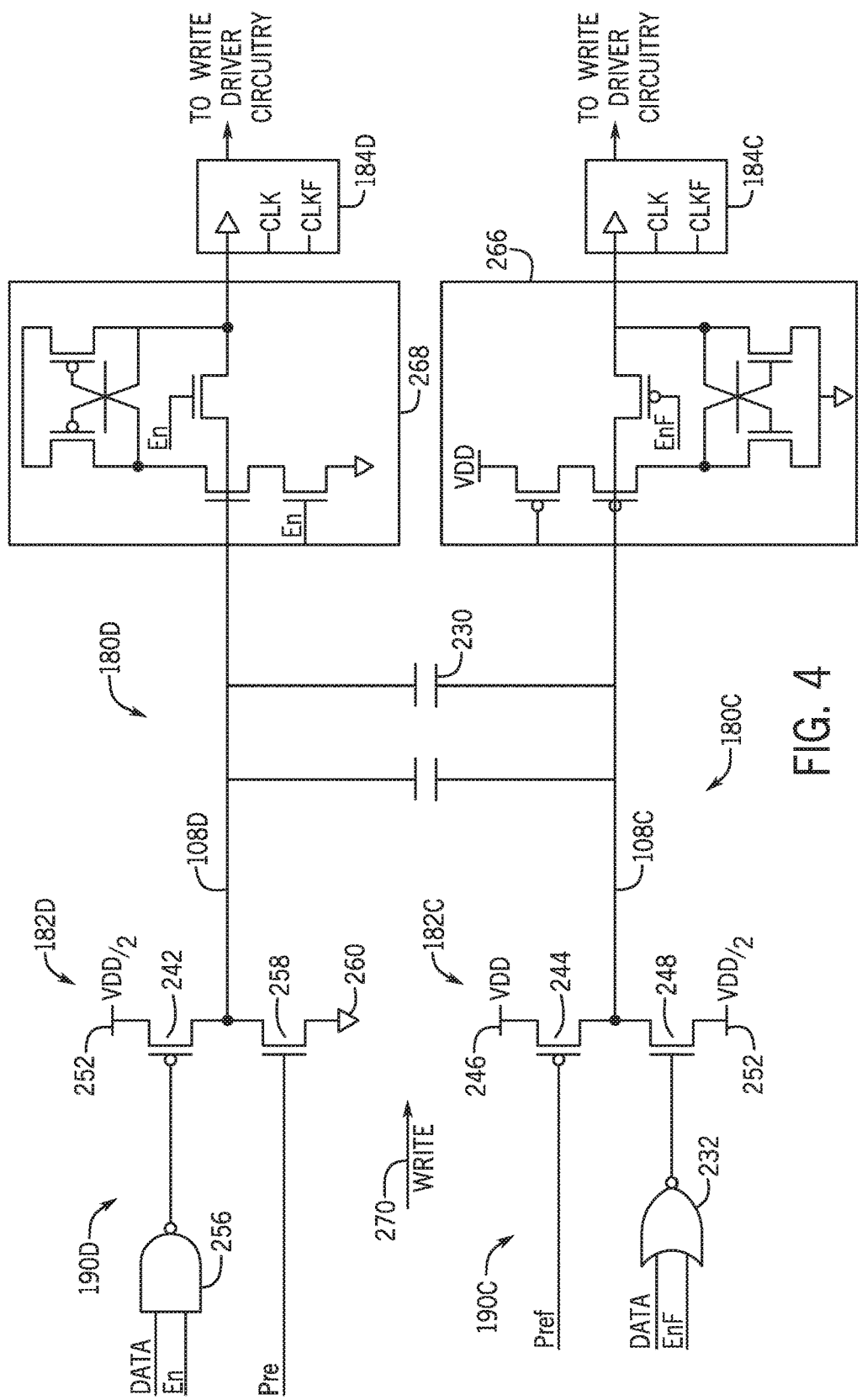
FIG. 4 is a second circuit diagram illustrating certain features of a second example the data path architecture of FIG. 2, according to an embodiment of the present disclosure.

FIG. 4 illustrates a second embodiment of circuitry of two example DRW lines 108 (e.g., DRW line 108C and 108D) between one or more DQ pads 50 and the write driver circuitry 98. The read/write circuitry 180C and 180D, between one or more DQ pads 50 and the write driver circuitry 98, may reduce power consumed by the read/write circuitry 180C and 180D in communicating data over respective DRW lines 108C and 108D. The DRW lines 108C and 108D may be example lines of DRW lines 108 of FIG. 2. The read/write circuitry 180C may receive data signals from the DQ pads 50 at the logic circuitry 190C. In the illustrated embodiment, the read/write circuitry 180C may receive a data signal, an enable signal, and a precharge false signal. The precharge false signal may be a complementary signal to a precharge signal that precharges DRW line 108D described below.

The logic circuitry 190C includes a NOR gate 232 that provides the data to the tri-state driver circuitry 182C. The tri-state driver circuitry 182C includes a first transistor 244 that electrically couples a voltage source 246 to the DRW line 108C to precharge the DRW line 108C to a HIGH state, such as to $V_{DD}$. Upon receiving an enable signal indicating that a write operation is enabled, the tri-state driver circuitry 182C may provide a HIGH signal to the register circuitry 184C via the DRW line 108C when the received data signal is in a HIGH state and provide a MEDIUM signal, such as $V_{DD}/2$ to the register circuitry 184C via the DRW line 108C when the received data signal is in a LOW state. The tri-state driver circuitry 182C provides the charge from the pre-charged DRW line 108C to provide the HIGH signal to the register circuitry 184C.

The tri-state driver circuitry 182C includes a second transistor 248 electrically coupled between the DRW line 108C and voltage regulation circuitry 252, illustrated as a line. To provide the LOW signal, the tri-state driver circuitry 182C may provide (e.g., dump) the charge from the pre-charged DRW line 108C onto voltage regulation circuitry 252 to reduce the charge on the DRW line 108C to a voltage between $V_{DD}$ and ground, such as $V_{DD}/2$. The voltage regulation circuitry 252 may include one or more capacitors and/or voltage regulators. The voltage regulation circuitry 252 may receive and/or store charge provided by (e.g., dumped from) the first tri-state driver circuitry 182C and utilize the received charge to drive the data signal on the DRW line 108D via the voltage regulation circuitry 252. That is, the voltage regulation circuitry 252 of the first tri-state driver circuitry 182C may be operatively coupled to the voltage regulation circuitry 252 (e.g., at a shared voltage potential), of the second tri-state driver circuitry 182D such that charge dumped from the first tri-state driver circuitry 182C onto the DRW line 108D via the voltage regulation circuitry 252 of the second tri-state driver circuitry 182D. Further, the voltage regulator of the voltage regulation circuitry 252 may maintain the voltage at approximately $V_{DD}/2$, for example, during repeated HIGH signals of read/write circuitry 180C where charge is not provided to read/write circuitry 180D.

In the illustrated embodiment, the read/write circuitry 182D includes logic circuitry 190D having a NAND gate 256. The NAND gate receives a data signal and an enable signal. The tri-state driver circuitry 182D includes a transistor 242 between the voltage regulation circuitry 252 and the DRW line 108D. Further, the tri-state driver circuitry 182D includes a transistor 258 between the DRW line 108D and ground 260. The transistor 258 receives a precharge signal to ground the DRW line 108D prior to data being delivered by DRW line 108D.

Upon receiving an enable signal that indicates enabling a write operation, the transistor 242 is controlled based on whether the data signal is in a HIGH state or a LOW state. If the data is in a HIGH state, the tri-state driver circuitry 182D drives the DRW line 108D to the MEDIUM state (e.g., $V_{DD}/2$). For example, the charge dumped from the tri-state driver circuitry 182C may be used to drive the DRW line 108D via the voltage regulation circuitry 252 to conserve power.

In the illustrated embodiment, the read/write circuitry 180C and 180D may each include voltage correction circuitry 266 and 268, respectively. The voltage correction circuitry 266 may pass through the data signal received from the DRW line 108C at the HIGH state (e.g., $V_{DD}$) or adjust the voltage of the data signal from the MEDIUM state (e.g., $V_{DD}/2$) to the LOW state (e.g., ground) to enable the register circuitry 184C to latch the desired value. Conversely, the voltage correction circuitry 268 may pass through the data signal received from the DRW line 108D at the LOW state (e.g., ground) or adjust the data signal received from the DRW line 108D from the MEDIUM state (e.g., $V_{DD}/2$) to be in the HIGH state (e.g., $V_{DD}$) to enable the register circuitry 184D to latch the desired value. The register circuitry 184C and 184D may then provide the latched value to the respective write driver circuitry 98 for storing the data. The register circuitry 184 and 184D may be circuitry similar to that described with respect to register circuitry 184A and 184B.

The DRW line 108C may operate at either the HIGH state or the MEDIUM state, and the DRW line 108D may operate at either the MEDIUM state or the LOW state, each of which may be referred to as a half swing. By operating across a half swing, power consumption by the read/write circuitry 180C and 180D may be reduced. For example, in a first case in which both read/write circuitry 180C and 180D toggle (e.g., dump the charge from the precharging), power dissipated by the read/write circuitry 180D may be described as discharging:

$$\text{Total average} = \qquad \qquad (4)$$
$$850\ fF * 128 * \frac{0.55\ v}{5\ ns} + 2 * 850\ fF * 128 * \frac{0.55\ v}{10\ ns} = 23.9\ mA$$

where the capacitance 230 is 850 femto Farads, there are 256 data lines, a half swing voltage is 0.55 volts, tCCDS is 2.5 nanoseconds, and tCCDL is 5 nanoseconds. In this example, the power dissipated from read/write circuitry 180C may be:

$$\text{Total average} = \qquad \qquad (5)$$
$$850\ fF * 128 * \frac{0.55\ v}{5\ ns} + 2 * 850\ fF * 128 * \frac{0.55\ v}{10\ ns} = 23.9\ mA$$

In the illustrated embodiment, 23.9 mA may be discharged from $V_{DD}$ and dumped into the voltage regulation circuitry 252 to be used by read/write circuitry 180D. Because the 23.9 mA is discharged onto the voltage regulation circuitry 252 and the voltage regulation circuitry 252 shares a common voltage potential on each of tri-state circuitry 182C and 182D, less or no additional charge may be used to power read/write circuitry 180D. For example, the 23.9 mA discharged on read/write circuitry 180C may be used for read/write circuitry 180D. In the first case in which both in this example, total charge dissipated from $V_{DD}$ may be 23.9 mA by storing the charge from the read/write circuitry 180C which is used by the read/write circuitry 180D.

In a second case in which read/write circuitry 180D is toggled and read/write circuitry 180C is not toggled, power dissipated by read/write circuitry 180D may be the same or similar to that described with equation (4). Power dissipated by read/write circuitry 180C may be at or near 0 mA as charge is not being dumped by the read/write circuitry 180C. Accordingly, total charge dissipated from $V_{DD}$ for the second case in this example may be 23.9 mA.

In a third case in which read/write circuitry 180C is toggled and read/write circuitry 180D is not toggled, power dissipated by read/write circuitry 180C may be the same or similar to that described with equation (5). Power dissipated by read/write circuitry 180D may be at or near 0 mA as charge is not being dumped by read/write circuitry 180D. Accordingly, total charge dissipated from $V_{DD}$ for this third case in this example may be 23.9 mA.

In a fourth case in which neither read/write circuitry 180C nor 180D are toggling, power dissipated may be at or near 0 mA as charge is not being dumped by read/write circuitry 180C and 180D. As mentioned above, these values (e.g., voltages, currents, data lines, capacitance, tCCDL, tCCDS, etc.) are meant to be illustrative, and any suitable values may be used. Further, in some embodiments, different cases may be used, such as half data toggling, among others.

Figure 5:
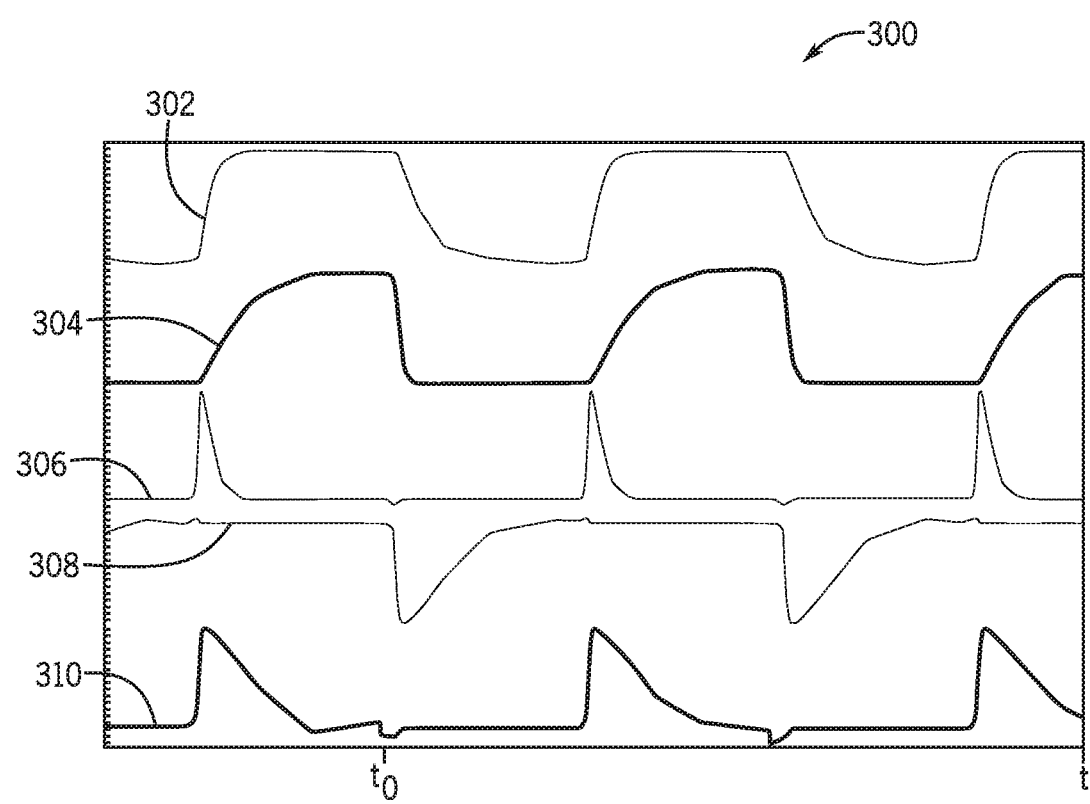
FIG. 5 is a graph that illustrates data communication over communication lines of the data path architecture of FIG. 4, according to an embodiment of the present disclosure.

FIG. 5 is a graph of a waveforms on the DRW lines 108C and 108D with respect to time from the first case described with respect to FIG. 4 in which both read/write circuitry 180C and 180D are toggled. Each of the waveforms shows magnitude with respect to time. The graph 300 includes a first waveform 302 which may be voltages measured on DRW line 108D of read/write circuitry 180D. The graph 300 has a second waveform 304 of voltages measured on DRW line 108C of read/write circuitry 180D. The graph 300 includes a third waveform 306 of power dissipated from VDD due to toggling of read/write circuitry 180D. Further, the graph 300 shows a fourth waveform 308 of charge being discharged onto VDD/2 due to toggling of read/write circuitry 180D and a fifth waveform 310 of power dissipated from VDD/2 due to toggling of read/write circuitry 180C. As shown by waveform 308, at time t0, as read/write circuitry 180C discharges power onto the voltage regulation circuitry 252, the discharged power may be used by the read/write circuitry 180D.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
   write driver circuitry configured to write data to and read data from a memory bank of the memory device;
   one or more DQ pads configured to send data to and receive data from the write driver circuitry;
   first tri-state driver circuitry configured to provide a first signal to a first data read/write (DRW) line coupled between the write driver circuitry and the one or more DQ pads, wherein the first signal is indicative of either a HIGH state or a MEDIUM state; and
   second tri-state driver circuitry configured to provide a second signal to a second data read/write (DRW) line coupled between the write driver circuitry and the one or more DQ pads, wherein the second signal is indicative of either the MEDIUM state or a LOW state, wherein a voltage level of the MEDIUM state is between a voltage level of the HIGH state and a voltage level of the LOW state.

2. The memory device of claim 1, wherein the first tri-state driver circuitry is configured to provide charge to voltage regulation circuitry of the second tri-state driver circuitry.

3. The memory device of claim 2, wherein the second tri-state driver circuitry comprises a capacitor to store the charge from the first tri-state driver circuitry.

4. The memory device of claim 2, wherein the voltage regulation circuitry is configured to provide the second signal indicative of the MEDIUM state across the second DRW line.

5. The memory device of claim 4, wherein the voltage regulation circuitry maintains the voltage level of the MEDIUM state at approximately a midpoint between the voltage level of the HIGH state and the voltage level of the LOW state.

6. The memory device of claim 1, comprising voltage correction circuitry electrically coupled between the first DRW line and register circuitry, wherein the register circuitry is electrically coupled between the voltage correction circuitry and the write driver circuitry, wherein the voltage correction circuitry is configured to output a third signal indicative of either the HIGH state or the LOW state based on the first signal to be stored in the register circuitry.

7. The memory device of claim 1, comprising voltage correction circuitry electrically coupled between the second DRW and register circuitry, wherein the register circuitry is electrically coupled between the voltage correction circuitry and the write driver circuitry, wherein the voltage correction circuitry is configured to output a third signal indicative of either the HIGH state or the LOW state based on the second signal to be stored in the register circuitry.

8. The memory device of claim 1, wherein the first signal indicative of a HIGH state corresponds to a binary one, wherein the first signal indicative of a MEDIUM state corresponds to a binary zero.

9. A system comprising:
   a processor;
   a motherboard; and
   one or more memory devices, each comprising:
      first tri-state driver circuitry configured to provide a first signal to a first data read/write (DRW) line coupled between write driver circuitry and one or more DQ pads, wherein the first signal is indicative of either a HIGH state or a MEDIUM state; and
      second tri-state driver circuitry configured to provide a second signal to a second data read/write (DRW) line coupled between the write driver circuitry and the one or more DQ pads, wherein the second signal is indicative of either the MEDIUM state or a LOW state, wherein a voltage level of the MEDIUM state is between a voltage level of the HIGH state and a voltage level of the LOW state;
      wherein the first tri-state driver circuitry is configured to provide charge to voltage regulation circuitry of the second tri-state driver circuitry.

10. The system of claim 9, wherein the first tri-state driver circuitry comprises:
    a first transistor coupled between a voltage supply and the first DRW line; and
    a second transistor coupled between the first DRW line and the voltage regulation circuitry, and wherein the second tri-state driver circuitry comprises:
    a third transistor coupled between the voltage regulation circuitry and the second DRW line; and
    a fourth transistor coupled between the second DRW line and ground.

11. The system of claim 10, wherein the second transistor and the third transistor are configured to operate based at least in part on one or more data signals.

12. The system of claim 10, wherein the first transistor is configured to close to charge the first DRW line upon receiving a precharge signal, prior to providing data on the first DRW line.

13. The system of claim 10, wherein the second transistor is configured to close to provide charge on the first DRW line to the voltage regulation circuitry based at least in part on one or more data signals.

14. The system of claim 10, wherein the fourth transistor is configured to close to charge the second DRW line to the voltage level of the MEDIUM state upon receiving a precharge false signal, prior to providing data on the second DRW line.

15. The system of claim 9, wherein the first signal indicative of a HIGH state corresponds to a binary one, wherein the first signal indicative of a MEDIUM state corresponds to a binary zero.

16. The system of claim 9, wherein the one or more memory devices comprise error-correcting code (ECC) circuitry on a die of the memory device.

17. A method comprising:
providing, from first tri-state driver circuitry, a first signal on a first data read/write (DRW) line coupled between write driver circuitry and one or more DQ pads, wherein the first signal is indicative of either a HIGH state or a MEDIUM state; and
providing, from second tri-state driver circuitry, a second signal on a second DRW line coupled between the write driver circuitry and one or more DQ pads, wherein the second signal is indicative of either the MEDIUM state or a LOW state, wherein the first tri-state driver circuitry is configured to provide charge to voltage regulation circuitry of the second tri-state driver circuitry, wherein a voltage level of the MEDIUM state is between a voltage level of the HIGH state and a voltage level of the LOW state.

18. The method of claim 17, comprising:
receiving a precharge false signal at a first transistor of the first tri-state driver circuitry;
receiving a data signal and an enable false signal at NOR logic circuitry;
sending a resultant signal from the NOR logic circuitry to a second transistor of the first tri-state driver circuitry; and
controlling operation of the first tri-state driver circuitry based on the precharge false signal and the resultant signal.

19. The method of claim 17, comprising:
receiving a data signal and an enable signal at NAND logic circuitry;
sending a resultant signal from the NAND logic circuitry to a first transistor of the second tri-state driver circuitry;
receiving a precharge signal at a second transistor of the second tri-state driver circuitry; and
controlling operation of the second tri-state driver circuitry based on the precharge signal and the resultant signal.

20. The method of claim 17, comprising receiving the first signal at voltage correction circuitry and outputting a third signal indicative of a binary one when the first signal is indicative the HIGH state and outputting a fourth signal indicative of a binary zero when the first signal is indicative the MEDIUM state.

\* \* \* \* \*